(12) United States Patent
Takeuchi

(10) Patent No.: US 7,178,116 B2
(45) Date of Patent: Feb. 13, 2007

(54) METHOD AND DEVICE FOR DESIGNING SEMICONDUCTOR INTEGRATED CIRCUIT AND LOGIC DESIGN PROGRAM

(75) Inventor: Kazutaka Takeuchi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 195 days.

(21) Appl. No.: 10/968,110

(22) Filed: Oct. 20, 2004

(65) Prior Publication Data

US 2006/0005152 A1 Jan. 5, 2006

(30) Foreign Application Priority Data

Jun. 30, 2004 (JP) ............................. 2004-193822

(51) Int. Cl.
*G06F 17/50* (2006.01)
(52) U.S. Cl. ............... 716/4; 716/5; 716/10; 716/18
(58) Field of Classification Search ............... 716/1, 716/4–6, 10–11, 18
See application file for complete search history.

(56) References Cited

U.S. PATENT DOCUMENTS

| 6,026,228 A * | 2/2000 | Imai et al. ..................... 716/18 |
| 6,543,041 B1* | 4/2003 | Scheffer et al. ................ 716/10 |
| 6,775,808 B1* | 8/2004 | Raje et al. ..................... 716/4 |

FOREIGN PATENT DOCUMENTS

| JP | 07-094586 | 4/1995 |
| JP | 07-334548 | 12/1995 |
| JP | 09-305648 | 11/1997 |

* cited by examiner

*Primary Examiner*—Paul Dinh
(74) *Attorney, Agent, or Firm*—Staas & Halsey LLP

(57) ABSTRACT

A method for designing a semiconductor integrated circuit includes performing logic design and physical design. The method estimates whether logic design data generated in the logic design is appropriate for use in the physical design before the physical design is started. The result of the estimation is fed back to the logic design and reflected in the logic design data.

11 Claims, 5 Drawing Sheets

| Chip Size [mm] X [mm] | 7.0×7.0 |
|---|---|
| Wiring layer quantity | 7 |
| Gate Quantity [Gate] | 8,000,000 |
| Operation Frequency [MHz] | 200 |
| Power Consumption [mW] | <500 |
| Operation Voltage [V] | 1.1~1.3 |
| Operation Temperature [℃] | -20~100 |
| Power Drop Amount [V] | <0.10 |
| Simultaneous Switching Noise Amount [V] | <0.4 |

Fig.6

| | |
|---|---|
| Chip Size [mm] × [mm] | 7.2×7.2 |
| Wiring layer quantity | 7 |
| Gate Quantity [Gate] | 8,000,000 |
| Operation Frequency [MHz] | 210 |
| Power Consumption [mW] | 550 |
| Operation Voltage [V] | 1.1~1.3 |
| Operation Temperature [℃] | −20~100 |
| Power Drop Amount [V] | 0.08 |
| Simultaneous Switching Noise Amount [V] | 0.3 |

Fig.7

| | |
|---|---|
| Chip Size [mm] × [mm] | 7.0×7.0 |
| Wiring layer quantity | 7 |
| Gate Quantity [Gate] | 8,000,000 |
| Operation Frequency [MHz] | 180 |
| Power Consumption [mW] | 480 |
| Operation Voltage [V] | 1.1~1.3 |
| Operation Temperature [℃] | −20~100 |
| Power Drop Amount [V] | 0.15 |
| Simultaneous Switching Noise Amount [V] | 0.5 |

METHOD AND DEVICE FOR DESIGNING SEMICONDUCTOR INTEGRATED CIRCUIT AND LOGIC DESIGN PROGRAM

CROSS-REFERENCE TO RELATED APPLICATIONS

This application is based upon and claims the benefit of priority from prior Japanese Patent Application No. 2004-193822, filed on Jun. 30, 2004, the entire contents of which are incorporated herein by reference.

BACKGROUND OF THE INVENTION

The present invention relates to a method for designing a semiconductor integrated circuit (LSI), and more particularly, to a design method, a design device, and a logic design program that are employed during the logic design stage for an LSI.

When designing an LSI, after performing logic design, physical design (layout design) is performed in a downstream process. During layout design, data obtained during the logic design is used to generate layout data. The layout data is subsequently checked. When the layout data does not satisfy the design conditions, layout design or logic design is performed again. That is, redesign is performed. Redesign (returning to an earlier point in the design flow) prolongs the design time. It is desired that the number of times of redesign is performed be reduced so that the LSI design is performed efficiently.

In the prior art, during logic design, the designing of a register transfer level (RTL) is performed based on the design specification of an LSI. Afterwards, logic synthesizing is performed based on the RTL design data to generate logic circuit data for a gate level, that is, to generate a so-called net list. When generating the net list, a target design value is provided with a margin based on data obtained during previous designing. The margin, which is determined through experience, absorbs the difference between the logic design and the layout design, or deviation from a target value, to reduce the number of times redesign is performed after layout design.

SUMMARY OF THE INVENTION

However, even when the margin is provided, redesign may become necessary after layout design. That is, even when predicting the required margin from previous design data, it often becomes apparent that design conditions are not satisfied when actually performing layout design.

In this case, the design conditions are changed and physical design is performed again. Nevertheless, this may not be sufficient for satisfying the design conditions. In such a case, the designing must return to the upstream logic design process to perform further redesign. The time consumed during layout design is normally longer than the time consumed during logic design. When returning to logic design to perform redesign, layout design must be performed from the beginning. Accordingly, the design time becomes extremely long.

One aspect of the present invention is a method for designing a semiconductor integrated circuit. The method includes performing logic design of the semiconductor integrated circuit to generate logic circuit data, and performing physical design of the semiconductor integrated circuit using the logic circuit data. The logic design includes estimating whether the logic circuit data is appropriate for use in the physical design before the physical design is started, and feeding back a result of the estimation to reflect the estimating result in the logic circuit data.

Another aspect of the present invention is a method for designing a semiconductor integrated circuit. The method includes generating logic circuit data, performing physical design of the semiconductor integrated circuit using the logic circuit data, checking whether the logic circuit data is appropriate for use in the physical design before the physical design is started, and changing the logic circuit data when the logic circuit data is not appropriate for the physical design by feeding back a result of the check to the generation of the logic circuit data. The method further includes repeating feedback, changing, and changing of the logic circuit data until the logic circuit data becomes appropriate for the physical design.

A further aspect of the present invention is a design device for generating a net list used in a process for physical design of a semiconductor integrated circuit. The device has a central processor unit including a data generating means for generating RTL design data based on specification data of the semiconductor integrated circuit and performing logic synthesizing based on the RTL design data to generate the net list. An estimating means estimates whether the net list is appropriate for use in the physical design process. A feedback means reflects an estimation result of the estimating means when the data generating means generates the net list.

Another aspect of the present invention is a computer readable program product provided with a computer readable media storing program code for generating a net list used in a process for physical design of a semiconductor integrated circuit. The program code when executed by a computer performs steps including generating RTL design data based on specification data of the semiconductor integrated circuit, generating the net list by performing logic synthesizing based on the RTL design data, estimating whether the net list is appropriate for use in the physical design process, and feeding back a result of the estimation to the generation of the net list so as to generate the net list so that it reflects the result of the estimation.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 6 and 7 are charts showing initial estimate results.

DETAILED DESCRIPTION OF THE PREFERRED EMBODIMENT

Figure 1:
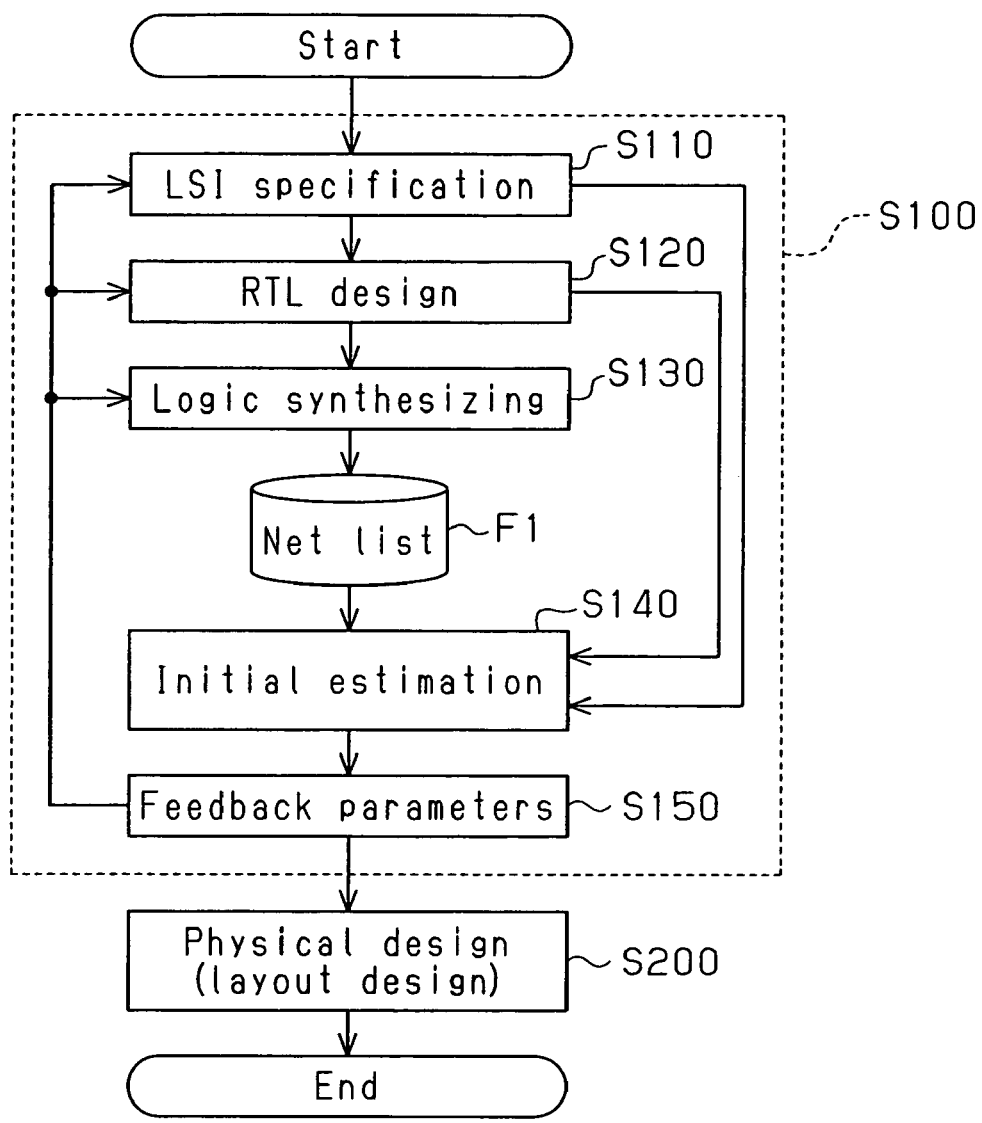
FIG. 1 is a flowchart illustrating an LSI design procedure according to a preferred embodiment of the present invention.

A device and method for designing a semiconductor integrated circuit (LSI) according to a preferred embodiment of the present invention will now be discussed.

The schematic configuration of an LSI design device 11 will now be described with reference to FIG. 4. The design device 11, which is a typical computer aided design (CAD) device, includes a CPU 12, a memory 13, a storage device 14, a display device 15, an input device 16, a drive device 17, and a bus 18 connecting the devices 12–17.

The CPU 12, which uses the memory 13 to execute programs, performs processing in accordance with a logic design program that is in compliance with an LSI design procedure illustrated in the flowchart of FIG. 1. The CPU 12 functions as a data generating means, an estimating means, and a feedback means.

The memory 13 includes a cache memory, a system memory, and a display memory. The display device 15 displays processing results and parameter input screens. The display device 15 may be, for example, a CRT, an LCD, or a PDP. The input device 16, which is used by a user to input requests, instructions, and parameters, includes a keyboard and a mouse.

The storage device 14 normally includes a magnetic disk device, an optical disc device, and a magneto-optic disc device. The storage device 14 stores programs for executing various types of processing and various types of files for storing data required to execute the programs. In accordance with instructions from the input device 16, the CPU 12 transfers programs and the data stored in the files to the memory 13 to execute the programs. The storage device 14 is also used as a database.

The programs executed by the CPU 12 are provided from, for example, a recording medium 19. The drive device 17 drives the recording medium 19 and accesses the recorded contents of the recording medium 19. The CPU 12 reads program and data from the recording medium 19 via the drive device 17 and installs the program and data in the storage device 14.

The recording medium 19 may be any type of recording medium, for example, an optical disc (CD-ROM, DVD-ROM, and so on) or a magneto-optic disc (MO, MD, and so on). The recording medium 19 may be a medium or a disc device recording programs that are uploaded or downloaded via a communication medium.

The method for designing an LSI will now be discussed.

FIG. 1 is a flowchart illustrating the entire flow of LSI designing. The design device 11 stores a program (logic design program) for performing the processing illustrated in the flowchart of FIG. 1.

LSI design may be roughly divided into two stages, a logic design stage S100 and a physical (layout) design stage S200. The characteristic features of the LSI design method according to the present invention are in the logic design stage S100. Before the layout design stage S200 is performed, that is, in a step upstream to the layout design stage S200, a net list F1 is checked to confirm that it is correct.

The logic design stage S100 will now be described.

In step S110, the design device 11 acquires the specification of an LSI (specification data).

In step S120, the design device 11 performs register transfer level (RTL) design in accordance with the LSI specification. The design device 11 then uses a register (flip-flop) and a combinational logic circuit to generate design data describing the LSI operation (hereinafter referred to as RTL design data) in HDL (Verilog-HDL) format.

In step S130, the design device 11 performs a logic synthesizing process based on the RTL design data to generate logic circuit data at the gate level, that is, to generate a net list F1. In the logic synthesizing process S130, a timing constraint F2 (refer to FIG. 2) is generated (not shown in FIG. 1) in addition to the net list F1. The timing constraint F2 regulates timing information that guarantees circuit operation in the net list F1.

In step S140, the design device 11 generates an initial estimate based on the net list F1. In the initial estimation step S140, the design device 11 checks whether the net list F1 is circuit information appropriate for use in the layout design stage S200. The layout design stage S200 is performed based on the net list F1. To avoid having to perform redesign after layout design, the net list F1 generated in the logic design stage S100 must be appropriate for the layout design stage S200.

In the preferred embodiment, the design device 11 determines whether the net list F1 is appropriate for use in the layout design stage S200. This determination is performed in the following manner. First, the values of data parameters (A1) to (A8) are estimated (refer to FIG. 3). The estimated value of each data parameter is referred to as an initial estimate value. The appropriateness of the net list F1 is determined from a comparison result of the estimate values and target values that are in accordance with the LSI specification.

(A1) Power Consumption F11

The power consumption is estimated from, for example, power consumption data (value listed in a library) of each cell included in the net list F1 and the operation frequency of each cell.

(A2) Power Drop Amount F12

The power drop amount may be estimated in the following manner. First, a resistance network and a current source of internal power lines in a core section are simplified using unit circuit models, which are electrically equivalent to one another and which are referred to as power units. Then, the resistance value of each power unit is calculated based on various power supply characteristics so as to achieve a target power drop value. The power drop value is calculated in this manner.

(A3) Timing F13

Timing information may be estimated from the calculated power consumption F11 and the power drop amount F12.

(A4) Core Size F14, Chip Size F15, Wiring Layer Quantity F16

The total wire length of the core section is estimated from the circuit information (e.g., cell quantity, net quantity, average fan out) of the net list F1. For each of the wiring layers capable of accommodating wires for the total wire length, a wire channel quantity is calculated to estimate the core size (area) F14 and the wiring layer quantity F16. The chip size F15 may be estimated by adding the area of a power I/O region to the calculated core size F14.

(A5) Simultaneous Switching Noise Amount F17

The simultaneous switching noise amount F17 may be estimated by calculating a power voltage fluctuation amount when output switching is simultaneously performed in an output I/O and an input/output I/O.

(A6) Power I/O Quantity F18

Power analysis of the core section is performed based on the estimated power consumption F11 and the internal power line network. The power I/O quantity satisfying the tolerable current value of the current flowing through the power I/O is calculated using the current value obtained from the voltage value at each node and the resistance value between nodes to estimate the power I/O quantity F18.

(A7) Power Line Quantity F19

The power line quantity F19 may be estimated by calculating the power amount (power line quantity per unit area) in accordance with the wiring layer quantity to which power lines may be allocated so that the power line quantity is equivalent to the resistance values of the power units (unit circuit models) that are used when estimating the power drop amount F12.

(A8) Decoupling Cell Amount F20

The decoupling cell amount may be estimated from the calculated power consumption F11.

The above data parameters each have a close correlation with layout design. The procedures for estimating the above parameters are only examples. Thus, the above parameters may be estimated through any procedure.

In step S150, after estimating each data parameter, the design device 11 selects at least one feedback parameter having a correlation with logic design to feed back to at least one of earlier steps S110 to S130 in the logic design stage S100 based on the estimation results. In the logic design stage S100, the net list F1 of the optimal circuit information is obtained by reflecting the feedback parameter.

Figure 3:
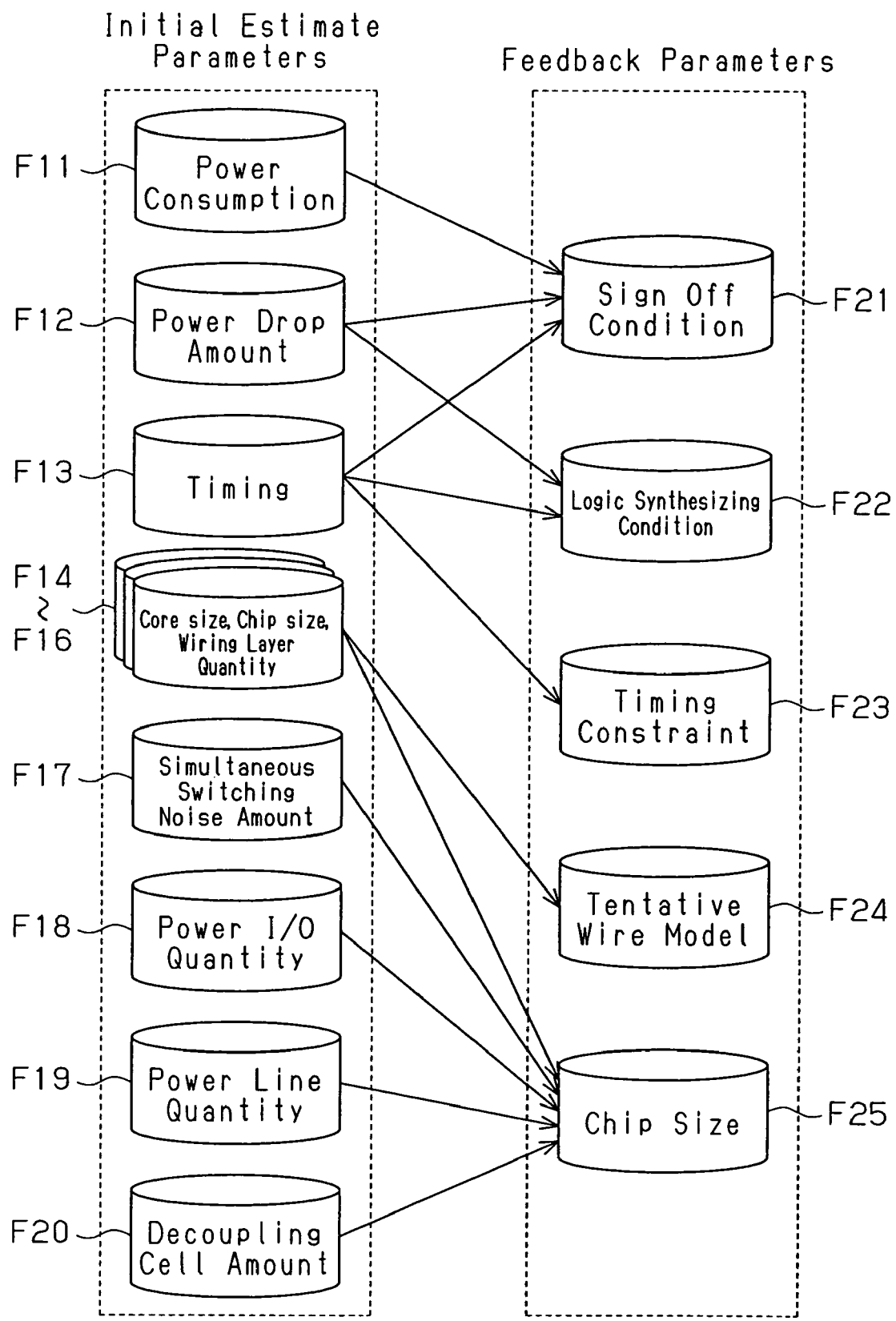
FIG. 3 is a chart illustrating the relationship between initial estimate parameters and feedback parameters.

In the preferred embodiment, parameters (B1) to (B5) described below are used as feedback parameters (refer to FIG. 3). Parameters (B1) to (B5) are evaluated based on the estimation results and the LSI specification.

(B1) Sign Off Condition F21

The sign off condition F21 determines the condition that affects the operation speed of a circuit, such as the PTV condition, the power drop amount, the power consumption, the wire PT difference, the clock cycle, and the timing margin amount of the clock cycle. The PTV condition is an operation condition determining the best condition and the worst condition for each of the three parameters of process (P), temperature (T), and voltage (V). When the initial estimate value for each of the power consumption F11, the power drop amount F12, and the timing F13 differs from the target value, the design device 11 changes the sign off condition F21 and feeds the changed sign off condition F21 back to the logic design stage S100.

(B2) Logic Synthesizing Condition F22

The contents of the logic synthesizing condition F22 are substantially the same as the sign off conditions F21. The logic synthesizing condition F22 differs from the sign off condition F21 in the determination of the timing margin amount. More specifically, the sign off condition F21 determines conditions at the point of time when the layout design ends. The logic synthesizing condition determines conditions during the logic synthesizing stage. The determination of the timing margin amount is performed by predicting the difference between the logic design and layout design (clock skew or the difference between the tentative wire capacitance and the actual wire capacitance) and reflecting the difference as a margin in the logic synthesizing condition. When the values of the power drop amount F12 and the timing F13 that are obtained through the initial estimation differ from their target values, the design device 11 changes the logic synthesizing condition F22 and feeds back the changed logic synthesizing condition F22 to the logic design stage S100.

(B3) Timing Constraint F23

Timing constraint information regulates the operation timing of a circuit and includes delay information calculated with a tentative wire model, which will be described later. When the value related with the timing F13 obtained from the initial estimation differs from the target value, the design device 11 changes the timing constraint F23 and feeds back the changed timing constraint F23 to the logic design stage S100.

(B4) Tentative Wire Model F24

The tentative wire model is used when performing a logic synthesizing process or the delay calculation. When the values of the core size F14, the chip size F15, and the wiring layer quantity F16, which are obtained during the initial estimation, differ from their target values, the design device 11 changes the tentative wire model F24 and feeds back the changed tentative wire mode F24 to the logic design stage S100.

(B5) Chip Size F25

The chip size F25, which is obtained through the initial estimation, is normally fed back to the logic design stage S100 without changing. However, if the values of the core size F14, the chip size F15, the wiring layer quantity F16, the simultaneous switching noise amount F17, the power I/O quantity F18, the power line quantity F19, and the decoupling cell amount F20, which are obtained through the initial estimation, differ from their target values, the design device 11 changes the chip size F25 in accordance with the difference from the target value and feeds back the changed chip size F25 to the logic design stage S100.

In this manner, the design device 11 evaluates the feedback parameters from the corresponding initial estimate parameters. The changed feedback parameters are fed back to one of steps S110 to S130 in the logic design stage S100 to perform logic design again. The initial estimation is performed again based on the net list F1 obtained in redesign. The logic design, initial estimation, and evaluation of the feedback parameters are repetitively performed until the estimation result satisfies the target values. Logic design ends when the estimation result satisfies the target values.

In this logic design method, the net list F1 optimal for layout design is generated in the logic synthesizing step, which is upstream to layout design.

During the logic design stage S100, redesign is unnecessary when the results of the first initial estimation satisfy the target values. In such a case, logic design ends at that point of time, and the layout design stage S200 is performed next.

The layout design stage S200 will now be discussed.

Figure 2:
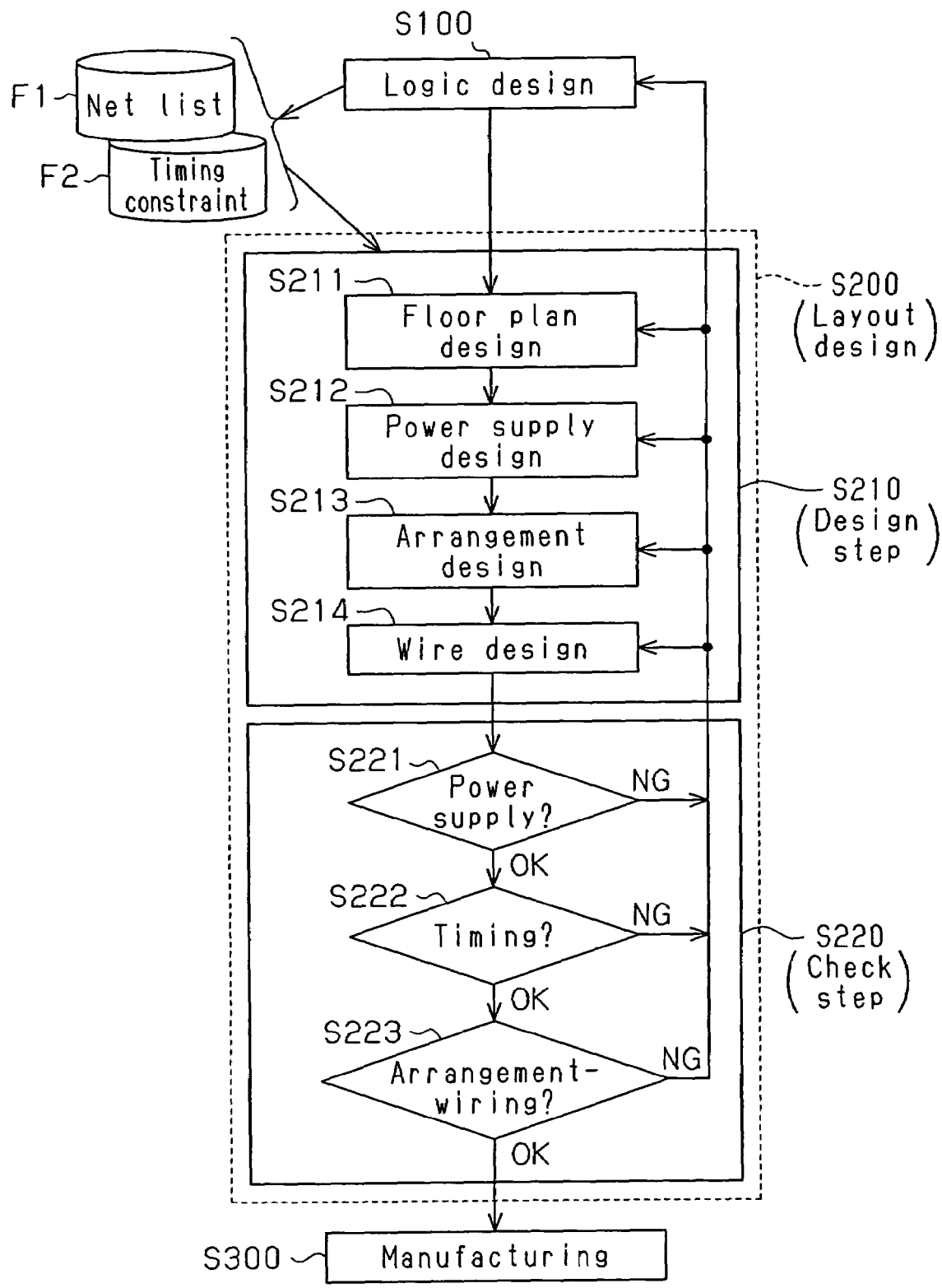
FIG. 2 is a flowchart illustrating layout design.

Referring to FIG. 2, layout design stage S200 is performed based on the data obtained through logic design, specifically, the net list F1 and the timing constraint F2. Layout design includes a step for designing a chip layout (physical design step, step S210) and a step for checking the layout data (step S220). In the preferred embodiment, the layout design (designing and checking) may be performed by a design device 11 storing a layout design program or by a device separate from the design device 11.

The design step S210 includes fours steps, which are a floor plan design step S211, a power supply design step S212, an arrangement design step S213, and a wire design step S214. In the floor plan design step S211, the design device 11 lays out function blocks and determines the entire configuration of a chip layout. In the power supply design step S212, the design device 11 lays out a power supply I/O. In the wire design step S210, the design device 11 lays out and wires cells. Data corresponding to the chip layout is generated in this manner.

The design device 11 performs a circuit simulation based on the layout data to conduct an operation check (i.e., power supply network analysis). More specifically, the design device 11 performs the power supply network analysis through three check steps, which are a power supply check step (step S221), a timing check step (step S222), and an arrangement-wiring check step (step S223). The power supply network analysis is performed to determine whether the chip layout guarantees the reliability of signals and the power supply.

When the result of each check is affirmative, that is, when the design conditions are satisfied and operations may be guaranteed, the design device 11 ends the layout design. Subsequently, the LSI is manufactured in a manufacturing stage (S300) in accordance with the layout data.

When the result of a check is negative, that is, when the design conditions are not satisfied and operations cannot be guaranteed, the design device 11 returns to the upstream design step in accordance with the level of the deficiency and performs redesign. When the deficiency is severe such that it cannot be corrected just by performing layout design again (returning to one of steps S211 to S214 to perform redesign), the design device 11 returns to the further upstream logic design to perform redesign (returns to stage S100 to perform redesign). In this manner, when it becomes necessary to return to logic design to perform redesign, the subsequent layout design must be entirely performed again from the beginning.

In the preferred embodiment, the logic design stage S100 is performed taking into consideration the downstream layout design stage. More specifically, in the logic design stage S100, an initial estimation for checking the circuit information of the net list F1 is performed, and the net list F1 reflecting the results of the initial estimation is generated. The net list F1 used in the layout design stage S100 is optimal for use in the layout design stage S200. This minimizes redesign after layout design.

In the preferred embodiment, initial estimation is performed after a logic synthesizing process. More specifically, during the initial estimation step S140, the circuit information of the net list F1 is input. However, the initial estimation step S140 may be performed based on the LSI specification or the RTL design data. In this case, the net list F1 is not generated. However, the initial estimation step S140 may be performed using the cell quantity (or gate quantity) corresponding to the LSI specification as information substituting the net list F1.

An example of LSI designing employing the design method of the present invention will now be described with reference to FIGS. 5 to 7.

Figures 4, 5:
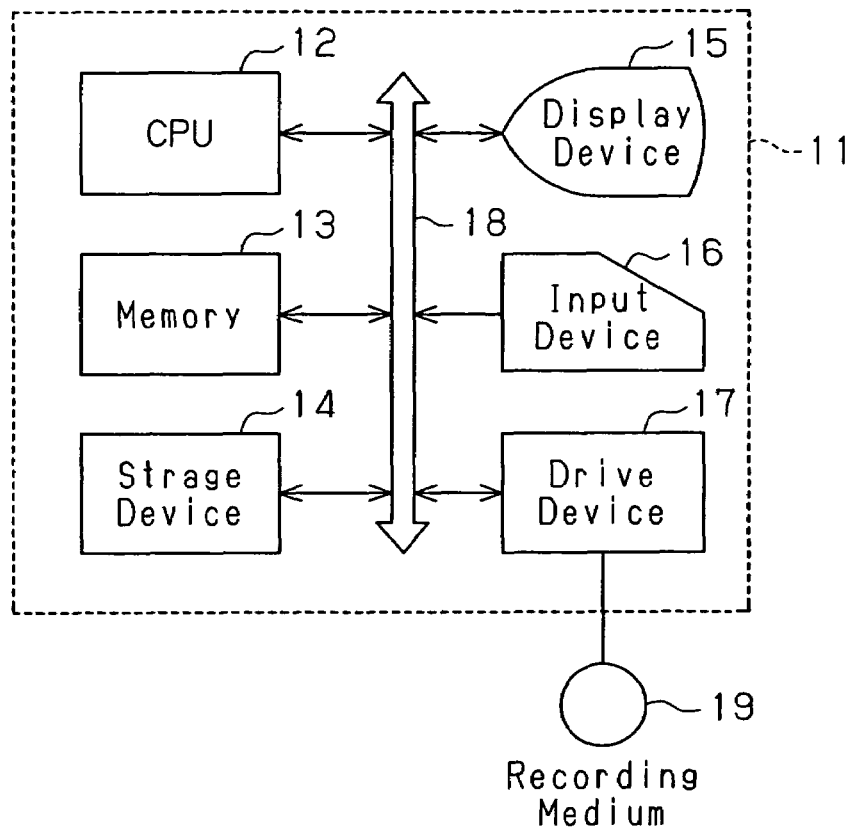
FIG. 4 is a schematic block diagram of a design device.
FIG. 5 is a chart showing an example of initial estimate values.

FIG. 5 shows input data (specification of an LSI) that is provided during the initial estimation step S140. The parameters used during the initial estimation step S140 are the wiring layer quantity, the gate quantity, the operation frequency, the operation voltage, the operational temperature, and the power drop amount.

For parameters of values having a range, the most severe condition during use of the LSI is selectively input. For example, the condition that maximizes the power consumption (voltage being 1.3 V and operational temperature being 100° C.) is input when estimating the power consumption.

FIG. 6 shows the result of the initial estimation based on the input data of FIG. 5. The chip size and the power consumption that are underlined do not satisfy the specification of FIG. 5.

As for the chip size, the target value is 7.0 mm×7.0 mm, whereas the estimation result is 7.2 mm×7.2 mm. In this case, to reduce the chip size, for example, at least one of increasing the wiring layer quantity, decreasing the gate quantity, and decreasing the power line quantity is performed.

As for the power consumption, the target value is less than 500 mW, whereas the estimation result is 550 mW. In this case, to reduce the power consumption, for example, at least one of decreasing the gate quantity, lowering the operation frequency (achieved frequency), lowering the operation voltage, or lowering the operational temperature is performed.

As values related with the estimate parameters change, the feedback parameters (refer to FIG. 3) related to the changed parameters are recalculated. The corrected feedback parameters are reflected in (fed back to) the logic setting step. In the example of FIG. 6, the evaluation result of the sign off condition F21 and the evaluation result of the chip size F25, which result from the change in the power consumption F11, are fed back to the logic design stage S100 to perform redesign.

FIG. 7 shows another result of an initial estimation performed based on the input data of FIG. 5. In this example, the operation frequency, the power drop amount, and the simultaneous switching noise amount, which are underlined, do not satisfy the specification of FIG. 5.

As for the operation frequency, the target value is 200 MHz, whereas the estimation result is 180 MHz. In this case, to increase the operation frequency, parameters related with timing are evaluated. For example, the operation voltage is increased or the operational temperature is decreased.

As for the power drop amount, the target value is less than 0.10 V, whereas the estimation result is 0.15 V. In this case, to decrease the power drop amount, for example, the power line quantity is increased.

As for the switching noise amount, the target value is less than 0.4 V, whereas the estimation result is 0.5 V. In this case, to decrease the switching noise amount, for example, the power I/O quantity is increased.

When the values of these estimate parameters are changed, the feedback parameters related with the change parameters (refer to FIG. 3) are evaluated. The feedback parameters that are corrected are reflected in (fed back to) the logic setting step. In the example of FIG. 7, the evaluation results of the sign off condition F21, the logic synthesizing condition F22, the timing constraint F23, which result from changes in the timing F13 and the power drop amount F12, and the evaluation result of the chip size F25, which results from the change in the simultaneous switching noise amount F17, are fed back to the logic design stage S100 to perform redesign.

This preferred embodiment has the advantages described below.

(1) In the logic design stage S100, the net list F1 obtained from the logic synthesizing result is estimated as to whether it is appropriate for use in layout design. Further, the estimation result is fed back to an earlier step in the logic design stage S100 and reflected to the circuit information of the net list F1. Thus, logic design is performed taking into consideration layout design. As a result, the net list F1 is appropriate for layout design. Accordingly, redesign subsequent to layout design is minimized. This shortens the design time and minimizes the design cost.

(2) When performing initial estimation, a plurality of parameters correlated with the layout design stage are estimated as initial estimate parameters. The estimation results correlated with logic design are fed back to the logic design stage S100. Thus, designing is performed in the logic design stage S100 taking into consideration the layout design stage S200. The data generated in this manner is further appropriate for use in the layout design stage S200.

(3) Initial estimation is performed using at least one of the LSI specification data, the RTL design data, and the net list obtained from the logic synthesizing result. As a result, the data generated during the logic design stage S100 is further appropriate for use in the layout design stage S200.

(4) In the preferred embodiment, the initial estimate parameters are the power consumption F11, the power drop amount F12, the timing F13, the core size F14, the chip size F15, the wiring layer quantity F16, the simultaneous switching noise amount F17, the power I/O quantity F18, the power line quantity F19, and the decoupling cell amount F20. By estimating these parameters, the data generated in the logic design stage S100 becomes further appropriate for use in the layout step.

(5) In the preferred embodiment, the feedback parameters are the sign off condition F21, the logic synthesizing condition F22, the timing constraint F23, the tentative wiring model F24, and the chip size F25. These parameters are fed back to reflect the estimate results in the logic design stage S100.

It should be apparent to those skilled in the art that the present invention may be embodied in many other specific forms without departing from the spirit or scope of the invention. Particularly, it should be understood that the present invention may be embodied in the following forms.

The initial estimate parameters (A1) to (A8) are only examples and other parameters may be used.

The feedback parameters (B1) to (B5) are only examples and other parameters may be used.

The estimation process does not have to be performed after the logic synthesizing process. For example, the estimation process may be performed after the LSI specification data is input in accordance with the input data. Alternatively, the estimation process may be performed after the RTL design data is generated in accordance with the generated data.

The present examples and embodiments are to be considered as illustrative and not restrictive, and the invention is not to be limited to the details given herein, but may be modified within the scope and equivalence of the appended claims.

What is claimed is:

1. A method for designing a semiconductor integrated circuit, the method comprising:
   performing logic design of the semiconductor integrated circuit to generate logic circuit data; and
   performing physical design of the semiconductor integrated circuit using the logic circuit data, wherein said performing logic design includes:
     generating the logic circuit data by inputting specification data of the semiconductor integrated circuit, generating RTL design data based on the specification data, and generating a net list based on the RTL design data through logic synthesizing;
     estimating whether the logic circuit data is appropriate for use in said performing physical design before said performing physical design is started; and
     feeding back a result of said estimating to reflect the estimating result in the logic circuit data, wherein said feeding back is performed prior to the physical design and includes feeding back the result of said estimating to a selected one of said inputting specification data, said generating RTL design data, and said generating a net list, in accordance with the result of said estimating.

2. The method according to claim 1, wherein said estimating whether the logic circuit data is appropriate includes:
   estimating whether values, in the logic circuit data, of a plurality of first parameters having a correlation with said performing physical design are appropriate for use in said performing physical design; and
   wherein said feeding back includes:
   estimating a plurality of second parameters having a correlation with said performing logic design based on a result of said estimating of the first parameters; and
   feeding back one of more of the second parameters to said performing logic design.

3. The method according to claim 2, wherein the first parameters are estimated based on at least one of the specification data of the semiconductor integrated circuit that is provided during said logic design, the RTL design data that is generated based on the specification data, and the net list generated based on the RTL design data through logic synthesizing.

4. The method according to claim 2, wherein the first parameters are selected from the group consisting of power consumption, power drop amount, timing information, core size, chip size, wiring layer quantity, simultaneous switching noise amount, power I/O quantity, power line quantity, and decoupling cell amount.

5. The method according to claim 2, wherein the second parameters are selected from the group consisting of a sign off condition, a logic synthesizing condition, a timing constraint, a tentative wire model, and chip size.

6. The method according to claim 1, wherein the feedback destination of the result of said estimating is varied in accordance with the result of said estimating.

7. A method for designing a semiconductor integrated circuit, the method comprising:
   generating logic circuit data by inputting specification data of the semiconductor integrated circuit, generating RTL design data based on the specification data, and generating a net list based on the RTL design data through logic synthesizing;
   performing physical design of the semiconductor integrated circuit using the logic circuit data;
   checking whether the logic circuit data is appropriate for use in said performing physical design before said performing physical design is started;
   changing the logic circuit data when the logic circuit data is not appropriate for said performing physical design by feeding back a result of said checking to selected one of said inputting specification data, said generating RTL design data, and said generating a net list, in accordance with the result of said checking; and
   repeating feedback, checking, and changing of the logic circuit data until the logic circuit data becomes appropriate for said performing physical design.

8. The method according to claim 7, wherein said performing physical design is performed after checking that the logic circuit data is appropriate based on the appropriate logic circuit data.

9. The method according to claim 7, further comprising:
   receiving input data for generating the logic circuit data, the input data including a plurality of parameters related with the specification of the semiconductor integrated circuit, wherein said checking includes:
estimating values, in the logic circuit data, of a plurality of first parameters having a correlation with the specification; and
checking whether the estimated value satisfies the specification.

10. A design device for generating a net list used in a process for physical design of a semiconductor integrated circuit, the device comprising a central processor unit including:
a data generating means for inputting specification data of the semiconductor integrated circuit, generating RTL design data based on specification data of the semiconductor integrated circuit and generating a net list based on the RTL design data through logic synthesizing;
an estimating means for estimating whether the net list is appropriate for use in the physical design process; and
a feedback means for feeding back an estimation result to a selected one of said inputting specification data, said generating RTL design data, and said generating a net list, in accordance with the estimation result to reflect the estimation result of the estimating means when the data generating means generates the net list.

11. A computer readable program product comprising computer readable media storing program code for generating a net list used in a process for physical design of a semiconductor integrated circuit, wherein the program code when executed by a computer performs steps including:
inputting specification data of the semiconductor integrated circuit;
generating RTL design data based on the specification data of the semiconductor integrated circuit;
generating the net list by performing logic synthesizing based on the RTL design data;
estimating whether the net list is appropriate for use in the physical design process; and
feeding back a result of said estimating to a selected one of said inputting, said generating RTL design data, and said generating the net lists, in accordance with the result of said estimating so as to generate the net list so that it reflects the result of said estimating.

* * * * *

UNITED STATES PATENT AND TRADEMARK OFFICE
CERTIFICATE OF CORRECTION

| | |
|---|---|
| PATENT NO. | : 7,178,116 B2 |
| APPLICATION NO. | : 10/968110 |
| DATED | : February 13, 2007 |
| INVENTOR(S) | : Kazutaka Takeuchi |

It is certified that error appears in the above-identified patent and that said Letters Patent is hereby corrected as shown below:

Column 10, Line 50, change "to" to --to a--.

Column 12, Line 16, change "lists," to --list,--.

Signed and Sealed this

Twenty-fifth Day of March, 2008

JON W. DUDAS
*Director of the United States Patent and Trademark Office*